United States Patent [19]

Ohgishi et al.

[11] Patent Number: 4,466,127
[45] Date of Patent: Aug. 14, 1984

[54] ENTRY APPARATUS OF DIGITAL VALUE IN MEMORY

[75] Inventors: Tsutomu Ohgishi, Hirakata; Tadashi Sakurai, Neyagawa, both of Japan

[73] Assignee: Sanyo Electric Co., Ltd.

[21] Appl. No.: 39,454

[22] Filed: May 16, 1979

Related U.S. Application Data

[62] Division of Ser. No. 825,183, Aug. 17, 1977, abandoned.

[30] Foreign Application Priority Data

Dec. 18, 1976 [JP] Japan .................................. 51-152176

[51] Int. Cl.³ .............................................. H03J 5/00
[52] U.S. Cl. .................................... 455/182; 455/183; 455/186
[58] Field of Search ............... 455/186, 185, 183, 184; 340/347 M, 347 AD

[56] References Cited

U.S. PATENT DOCUMENTS 3,849,635 11/1974 Freedman ................... 235/92 PE X
3,990,027 11/1976 Kawashima ..................... 455/186 X
4,023,108 5/1977 Torii ............................... 455/183 X Primary Examiner—T. J. Sloyan
Attorney, Agent, or Firm—Darby & Darby

[57] ABSTRACT

A radio receiver having a counter which generates a count value corresponding to the frequency of a station to be received which value is stored in a memory through a load enable signal produced when a ramp voltage reaches a value corresponding to a comparison voltage set to correspond to the frequency. The stored count value controls a programmable divider of a phase lock loop circuit to cause the oscillator of the circuit to produce the correct local oscillator frequency to be received. An N-nary counter permits only every Nth count value to be stored in the memory to correspond to the frequency spacing between stations.

5 Claims, 10 Drawing Figures

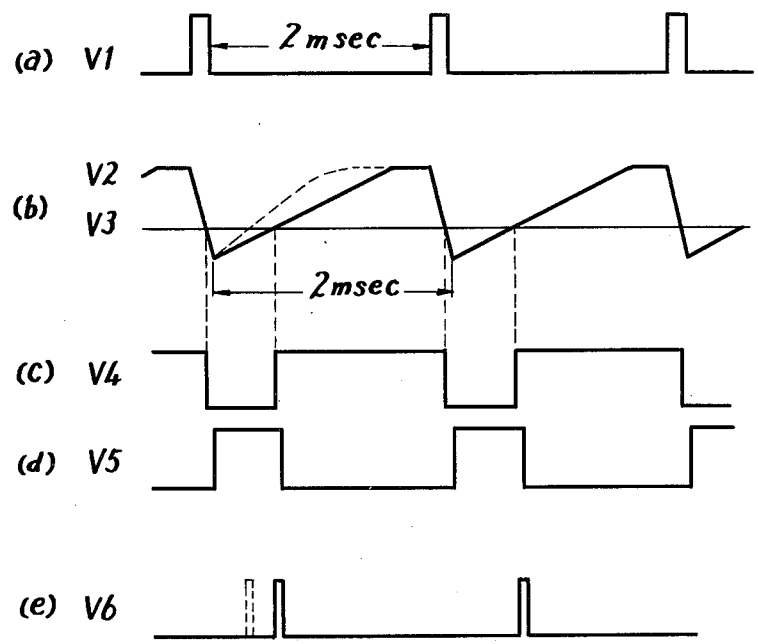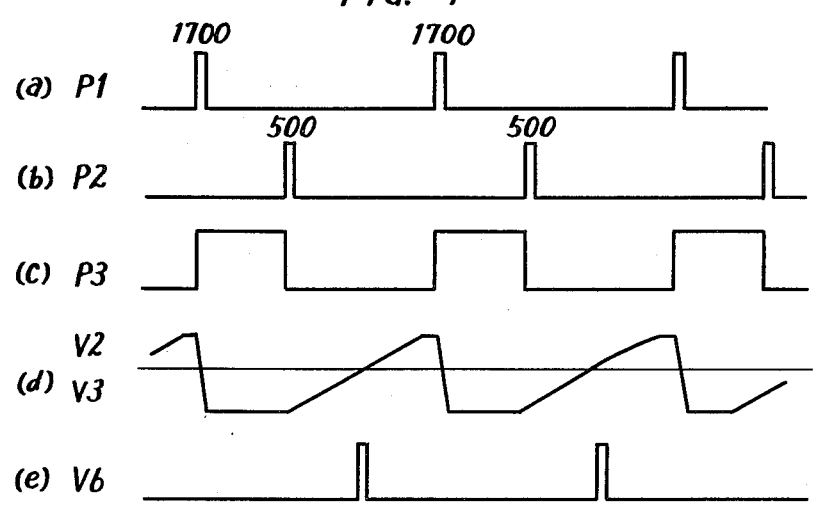

ENTRY APPARATUS OF DIGITAL VALUE IN MEMORY

RELATED APPLICATION

This application is a division of prior copending application Ser. No. 825,183, filed Aug. 17, 1977, now abandoned and replaced by continuation application Ser. No. 79,532, filed Sept. 27, 1979 and assigned to the same assignee.

BACKGROUND OF THE INVENTION

1. Field of the Invention

The present invention relates to an entry apparatus of a memory, and more specifically relates to such an apparatus adapted for easy entry of a digital value in a memory.

2. Description of the Prior Art

As electronic equipment capable of handling the data in a digital form developed, various data handled in an analog value form in the past has been recently handled in a digital value form than before. A major reason is that once an analog value is converted into a digital value, the data processing of a digital value is extremely easy as compared with the analog value data processing, while the digital value data processing is of high accuracy as compared with the analog value data processing. In addition, the recent development of digital integrated circuits made inexpensive the cost of manufacture of various digital electronic equipment. For these reasons, in many applications conventional analog electronic equipment has been replaced by digital electronic equipment.

In using such digital electronic equipment, it is frequently required that various values are entered or set in a digital value form or are preset by way of initial setting. Such applications that require entry or presetting of a digital value in digital electronic equipment comprise, for example, a radio receiver which can be directly set with digital value data concerning the frequency to be received, a television receiver which can store digital data values concerning the tuning frequency of each channel, an automatic weighing apparatus which is adapted to preset various unit prices, an automatic vending machine which is adapted to process preset prices of various commodities, and the like.

Typically, such digital values are loaded or preloaded in a digital memory such as a core memory, a semiconductor memory, or the like in such digital electronic equipment. Various methods for loading the data or digital values in such a digital memory have also been proposed. Typical methods are described as follows:

(1) A digital switch type

This type comprises a number of digital switches each allotted for each digit of the digital data, such that each digital switch can be set to a desired value in the corresponding digit. According to this type, the larger the number of digits of the data, the greater the number of digital switches to be operated, resulting in tiresomeness in setting the data. Another disadvantage encountered in this type is that the setting of the data is very difficult where the numerical value of the data to be set is not known, such as in case where the frequency of the radio broadcasting is not known.

(2) A ten key type

This type employs a set of ten keys adapted for entry of the numerals 0 through 9. Although this type is advantageous in case where the specific numerical value of the data is known, it is inconvenient in the case where the numerical value of the data is not known, as discussed supra.

(3) An up/down counter type

This type employs an up/down counter operable in response to clock pulses, the count output of which is utilized as the numerical value of the data to be set. Since such a count output is sequentially changeable, the same can be advantageously utilized in setting a numerical value which is unknown to the operator. Assuming, for example, a case where a numerical value associated with the broadcasting frequency is to be set in a radio receiver of a frequency synthesizer type, such as the numerical value "851" corresponding to the broadcasting frequency 85.1 MHz, a counter adapted to be operable responsive to the clock pulses makes use of the count output and, when the numerical value 851 is reached in the counter, the broadcasting frequency is received and a reproduced sound is heard. Thereafter, application of the clock pulses to the counter is locked in to set the numerical value 851 in a memory to continually supply the numerical value to the frequency synthesizer. According to this system, however, two types of manual operations are required for up and down counting operations, while a substantial time period is required to cycle throughout a given range of the numerical value to be obtained from the counter. In order to avoid such a problem, preferably two types of operations, quick and slow rates of the change are preferably accommodated by changing the repetition frequency rate of the clock pulses. However this type of operation results in poor operational performance.

SUMMARY OF THE INVENTION

Briefly described, the present invention comprises an entry apparatus for a digital memory comprising a counter for repetitively providing the digital numerical values in a given range over a given cycle, a digital memory adapted to be loaded with the digital numerical value in the counter responsive to a load enable signal, and a load enable signal generator for generating a load enable signal to the digital memory over the same cycle as that of the counter such that the timing of the load enable signal is manually adjustable, whereby manual operation of the load enable signal generator for adjusting the timing of the load enable signal allows the numerical value in the counter to be loaded in the digital memory.

As described in the foregoing, the present invention is structured such that a memory is loaded with the count output from a counter in response to a load enable signal the timing of which is adjustable, whereby a desired count output associated with the timing of the load enable signal as adjusted is loaded in the memory. Therefore, any desired digital value can be loaded in the memory with extreme ease, as compared with the loading of the value by the use of the conventional entry apparatus of such as a digital switch type, ten key type, up/down counter type and the like. According to the present invention, even if the number of digits of the digital value to be loaded is increased, the number of switches, and thus the number of operations as in case of the conventional digital switch type, is not increased. Also, decreased time is required in loading the value as compared to the conventional up/down counter type. On the other hand, from the stand point of implementing the entry apparatus in the form of an integrated circuit, the conventional digital switch type entry apparatus is disadvantageous in that a number of connections are required between the switch and the integrated circuit, whereas the inventive entry apparatus merely requires one connection between an externally provided variable resistor, or variable capacitor, and the integrated circuit, resulting in simplicity of wiring and reduced trouble.

According to a preferred embodiment of the present invention, after a desired digital value is loaded in the memory, the memory is prevented from being loaded with a new digital value by preventing a load enable signal to the memory until renewal of the loaded data is required. As a result, any fluctuation of the digital value once loaded in the memory can be prevented. Accordingly, if the digital value stored in the memory is to be displayed in a display, flickering of visual indication can be prevented. In the case where a display is made in a dynamic manner or on a time sharing basis, a timing pulse is required. Such a timing pulse can be obtained by frequency dividing the output from a reference oscillator typically comprising a crystal oscillator by the use of a counter. Therefore, it is not required to separately provide a timing pulse generator.

As described above, according to a further aspect of the present invention, the output of the counter can be loaded with certainty at a predetermined interval, and therefore assured and simple tuning can be attained with respect to the broadcasting frequencies of, say, 9 KHz intervals, if the present invention is applied to a frequency synthesizer type receiver.

Therefore, a principal object of the present invention is to provide an improved entry apparatus for a digital memory, wherein entry of a desired digital value in the digital memory is facilitated.

An aspect of the present invention is to load in a digital memory a numerical value within a prescribed range out of the values obtainable in a counter.

Another aspect of the present invention is to load in a digital memory a numerical value obtained in a counter at a predetermined cycle.

These objects and other objects, features, advantages and aspects of the present invention will become more apparent from the following detailed description of the present invention when taken in conjunction with the accompanying drawings.

BRIEF DESCRIPTION OF THE DRAWINGS

FIG. 3 shows waveforms of the signals at various portions in the FIG. 2 diagram;

FIG. 7 shows waveforms of the signals at various portions of the FIG. 6 embodiment;

DESCRIPTION OF THE PREFERRED EMBODIMENTS

Figure 1:
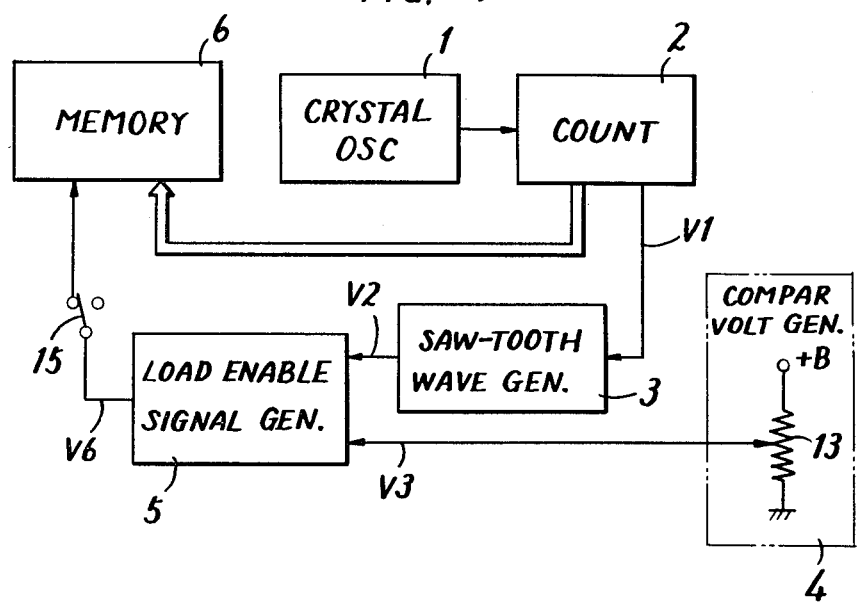
FIG. 1 is a block diagram of one embodiment of the inventive digital value entry apparatus.

Referring to FIG. 1, a block diagram of a digital value entry apparatus in accordance with the present invention is shown. The reference signal output from a reference oscillator 1, which can be of a crystal type, is applied to a counter 2 where the reference signal is counted to provide a count output as a changeable digital value. A saw-tooth wave generator 3 is provided so as to generate a saw-tooth wave such that the saw-tooth waveform is changeable as a function of and in synchronism with the counter output. A comparison voltage generator 4 is also provided which may typically comprise a variable resistor 13. A load enable signal generator 5 is provided to receive the saw-tooth wave output from the saw-tooth wave generator 3 and the comparison voltage output as set in the comparison voltage generator 4. The load enable signal generator 5 is structured to compare the saw-tooth wave output and the comparison voltage output to provide a load enable signal whenever both outputs coincide with each other. A digital memory 6 is provided to be responsive to the load enable signal from the load enable signal generator 5 to load therein the count output in the counter 2 which has been attained when the load enable signal is obtained.

Figure 2:
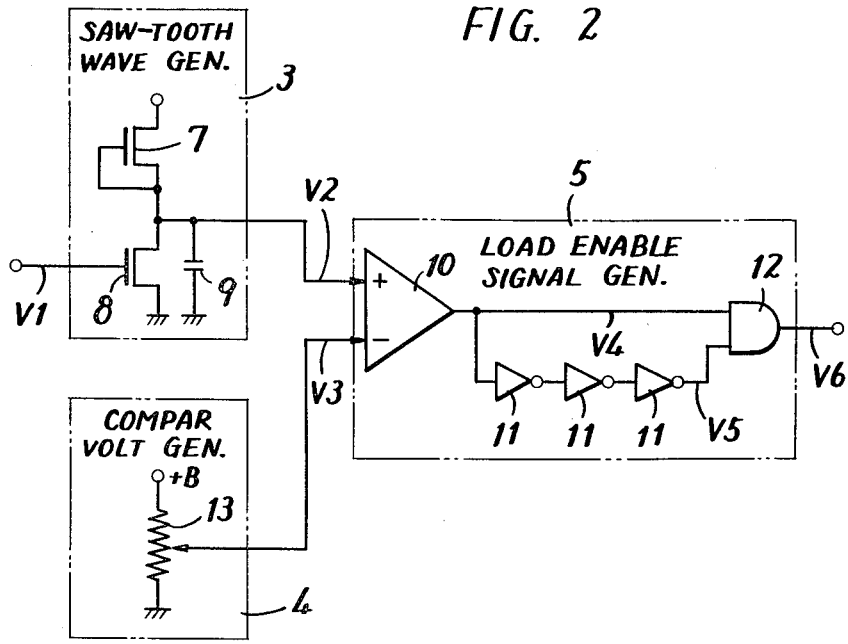
FIG. 2 is a schematic diagram of the saw-tooth wave generator and the load enable signal generator of the FIG. 1 embodiment.

Referring to FIG. 2, a schematic diagram of the saw-tooth wave generator 3 and the load enable signal generator 5 is shown. Referring to FIG. 3, waveforms of the signals at various portions in the FIG. 2 diagram are shown. Referring to FIG. 2, the saw-tooth wave generator 3 comprises two series connected insulated gate field effect transistors 7 and 8 and a capacitor 9 connected in parallel with the transistor 8. The load enable signal generator 5 comprises a voltage comparator 10 implemented by a differential amplifier, three series connected inverters 11 connected from the output of the voltage comparator 10, and an AND gate 12 connected to receive the output of the voltage comparator 10 and the output of the series connected inverters 11. The reference oscillator 1 is structured to oscillate at a frequency of 1 MHz. The counter 2 is structured to be responsive to the reference signals from the reference oscillator 1 to make a repetitive counting operation of the number 2000 from 0 to 1999. The counter 2 is structured to provide a carry output signal V1 (see FIG. 3(a)), whenever the count value changes from 1999 to 0. The carry output signal V1 is applied to the gate electrode of the insulated gate field effect transistor 8. Therefore, each time the carry output signal V1 is applied to the gate electrode of the transistor 8, the transistor 8 becomes conductive to instantaneously discharge the electric charge in the capacitor 9 through the transistor 8. After the transistor 8 returns to a conductive state, a current flows through the transistor 7 to the capacitor 9, whereby the capacitor 9 is charged with the time constant determined by the resistance value of the transistor 7 and the capacitance value of the capacitor 9. When the carry output signal V1 is applied from the counter 2 to the gate electrode of the transistor 8 again, the charge stored in the capacitor 9 is instantaneously discharged. Thus, the output V2 of the saw-tooth wave generator 3 exhibits a change as shown in FIG. 3(b) in synchronism with the output V1 from the counter 2. Since the oscillation frequency 1 MHz from the reference oscillator 1 is frequency divided by the counter 2 to 1/2000, the frequency of the carry output signal V1 becomes 500 Hz. As a result, the saw-tooth wave generator 3 provides a saw-tooth wave which is changeable in synchronism with the output V1 from the counter 2 at a cycle of 2 milliseconds.

Although in the foregoing description the saw-tooth wave generator 3 was described as providing the output waveform changeable in synchronism with a carry output signal obtainable from the counter 2, any other signal representative of the repetitive change of the count value in the counter may be utilized.

The output V2 from the saw-tooth wave generator 3 is applied to one input to the voltage comparator 10 and the output V3 from the comparison voltage generator 4 (see FIG. 3(b)) is applied to the other input to the voltage comparator 10. Therefore, the output V4 from the voltage comparator 10 becomes the low level if and when the output V2 is smaller than the output V3 and becomes the high level if and when the output V2 is larger than the output V3 (see FIG. 3(c)). The output V4 from the voltage comparator 10 is directly applied to one input to the AND gate 12. On the other hand, the output V4 from the voltage comparator 10 is inverted and delayed through the three series connected inverters 11 and the output V5 thus obtained (see FIG. 3(d)) is applied to the other input to the AND gate 12. Referring to FIG. 3, if and when both the outputs V4 and V5 assume a high level, the output V6 from the AND gate 12 also becomes a high level, which is withdrawn as a load enable signal and is applied to the memory 6 (see FIG. 3(e)). From the foregoing description, it would be appreciated that by changing the voltage value of the comparison voltage V3, through manual operation of the variable resistor 13, the timing of the load enable signal can be adjusted, and as a result any desired value within the range of "0" to "1999" as counted in the counter 2 which is repeated at a cycle of 2 milliseconds can be selected by manually adjusting the variable resistor 13 and the same can be loaded in the memory 6.

It is pointed out that although in the above described embodiment the variable resistor 13 was adjusted to change the comparison voltage V3 for the purpose of changing the timing of the load enable signal, the timing of the load enable signal can be adjusted by using a variable capacitor as the capacitor 9 in the saw-tooth wave generator 3 and by changing the gradient of the saw-tooth wave through change of a capacitance value, with the comparison voltage kept constant, as seen in the dotted line in FIG. 3.

From the foregoing description, it would be appreciated that the saw-tooth wave generator 3 was employed to provide a signal of a waveform having a ramp portion for providing a gradually changing voltage which is to be compared with the comparison voltage V3 and the linearity of the said ramp portion is not so important to the present invention. Therefore, the charging current for the capacitor 9 need not necessarily be a constant current. Therefore, the transistor 7 having a constant current characteristic may be replaced by a resistor. Alternatively, the transistor 7 may be replaced by a variable resistor so that adjustment of the variable resistor enables adjustment of the waveform of the output from the saw-tooth wave generator 3. In the following, therefore, the embodiment is described by taking an example wherein the comparison voltage V3 is adjusted through adjustment of a variable resistor, as shown in FIG. 2.

It is further pointed out that if a relatively higher numerical value of the output from the counter 2, such as the numerical value in the vicinity of 1999, need not be written in the memory the waveform of the saw-tooth output from the saw-tooth wave generator 3 may be distorted to some extent at the end portion of the ramp region, that is, the saw-tooth waveform may be similar to trapezoidal. In this context, the term "ramp wave signal" is adopted to broadly cover the saw-tooth wave, the trapezoidal wave, sine wave, and the like for the purpose of the present invention.

As described above, the embodiment shown and described in the foregoing is adapted to repetitively provide from the counter 2 the digital value of "0" to "1999" at the cycle of 2 milliseconds. Now let it be assumed that a given digital value output, say 1000, of the counter 2 is loaded in the memory 6 by manually adjusting the variable resistor to adjust the timing of the load enable signal. Then, the memory 6 is repetitively loaded with the digital value "1000" at the cycle of 2 milliseconds. However, after once a desired value is loaded in the memory 6, the same value need not be repetitively loaded in the memory 6. Conversely, if the apparatus had been adapted to be kept repetitively loaded with the same value even after the desired value is once loaded, then a slight fluctuation of the timing of the load enable signal because of fluctuation of the source voltage could cause a slightly deviated digital value such as the values "1001", "999" or the like to be reloaded with respect to the desired value "1000". Therefore, if and when the data loaded in the memory 6 is displayed by a display, a flickering of the display could be observed or a different numerical value could be displayed. Moreover, if the present invention is employed in a frequency synthesizer radio receiver, as to be described subsequently, then a different numerical value is reloaded in the memory after a desired numerical value concerning the desired broadcasting frequency is loaded in the frequency, with the result that good reception of the desired broadcasting frequency becomes impossible. In order to avoid such shortcomings, the apparatus may be structured such that after a desired numerical value is loaded in the memory, further load enable signals are prevented from being applied to the memory, while the load enable signal is allowed to be applied to the memory only if a desired numerical value is to be loaded in the memory.

Referring again to FIG. 1, for the above described purpose, the embodiment shown is structured such that a switch 15 is provided on the line for applying the load enable signal to the memory 6, thereby to prevent the load enable signal from being applied to the memory by opening the switch 15 after a desired value is loaded in the memory through adjustment of the variable resistor 13. According to this embodiment, first the switch 15 is closed and then the variable resistor is adjusted to a desired value, which requires two manual operations and for this reason is tiresome.

Figure 4:
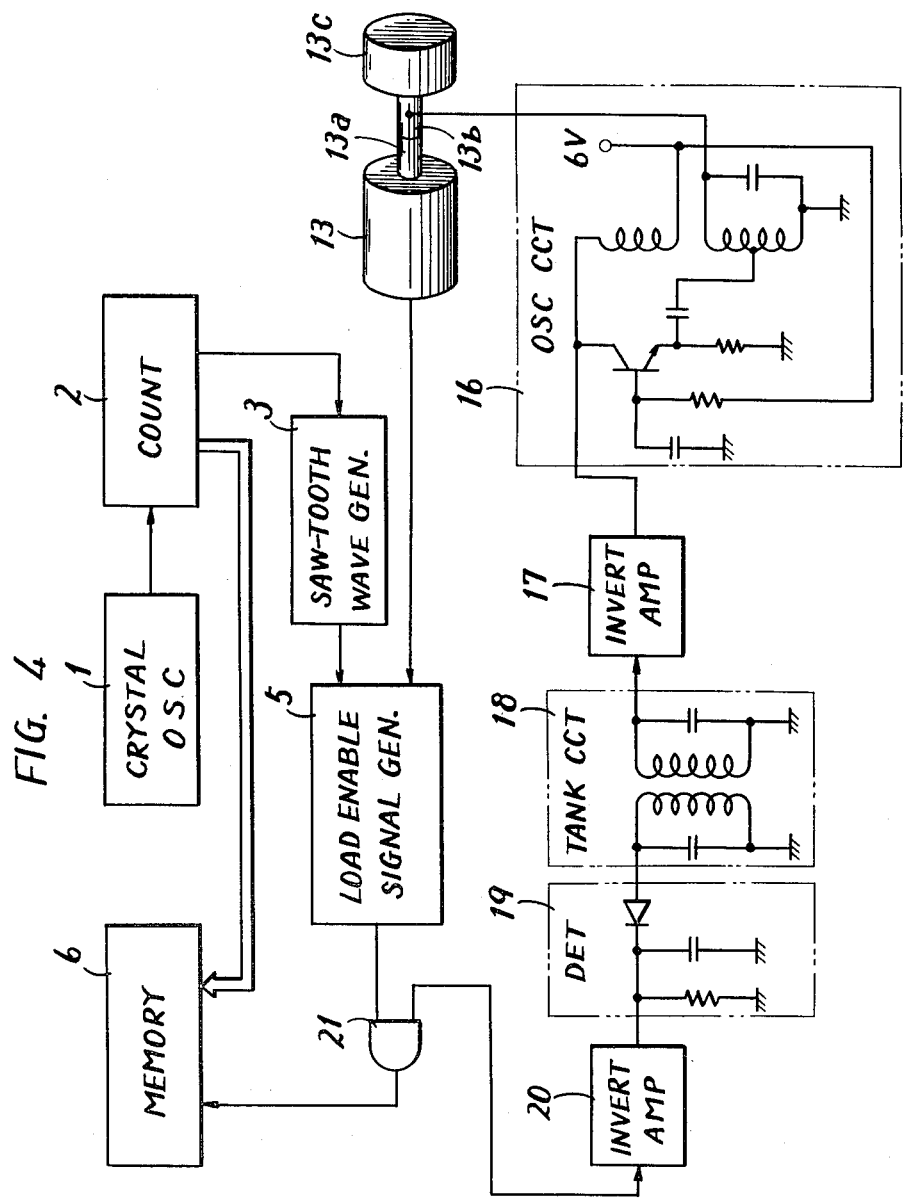
FIG. 4 is a block diagram of another embodiment of the present invention employing a load enable signal preventing means combined with a touch switch.

FIG. 4 shows an embodiment comprising an improvement in the FIG. 1 embodiment wherein upon manual touching of a knob in an attempt to adjust a variable resistor, a touch switch is enabled responsive to the touching thereby to allow the load enable signal to be applied to the memory. Referring to FIG. 4, the saw-tooth wave generator 3, the load enable signal generator 5 and the memory 6 are the same as those in the above described embodiment of FIGS. 1-3. The FIG. 4 embodiment additionally comprises an oscillation circuit 16 having a tank circuit, an amplifier 17, a tank circuit 18, a detector 19, an inverting amplifier 20, and an AND gate 21. The oscillation frequency of the oscillation circuit 16 is selected to be about 2 MHz and accordingly the tank circuit 18 is structured to be tuned to the frequency of 2 MHz. The variable resistor 13 comprises a shaft which includes an insulated portion 13a and a conductive portion 13b, the conductive portion 13b being connected to a conductive knob 13c. If and when the knob 13c is touched by a hand in an attempt to operate the variable resistor 13, a capacitance of several tens pF of the human body with respect to ground causes the value of capacitance of the capacitor C1 in the oscillation circuit 16 equivalently to be larger than the inherent value of 10 pF, which causes the oscillation frequency to be lower than 2 MHz. As the oscillation frequency changes, the output from the oscillation circuit 16 is not allowed to pass through the tank circuit 18, with the result that no output is obtained from the detector 19. As a result, the output from the inverting amplifier 20 assumes a high level and the AND gate 21 is enabled. As a result, the load enable signal is allowed to pass through the AND gate 21 to be applied to the memory 6, whereby the memory 6 is enabled to load the new numerical value from the counter 2. If the knob 13c is not touched by the finger, the output from the inverting amplifier 20 is at the low level and the AND gate 21 is disabled, whereby the load enable signal is prevented from being applied to the memory 6.

In the above described embodiment, a touch switch for detecting the change of the capacitance value occuring upon touching of the hand on a knob was utilized. Alternatively, however, a pressure sensitive type touch switch for detecting a pressure occuring upon touch of the hand on the knob, or a short circuit type touch switch adapted for short circuiting through the human body upon touching of the hand on the knob, or the like may be utilized.

Now a description will be made of an example of applications of the inventive entry apparatus of a digital value in a memory.

Figure 5:
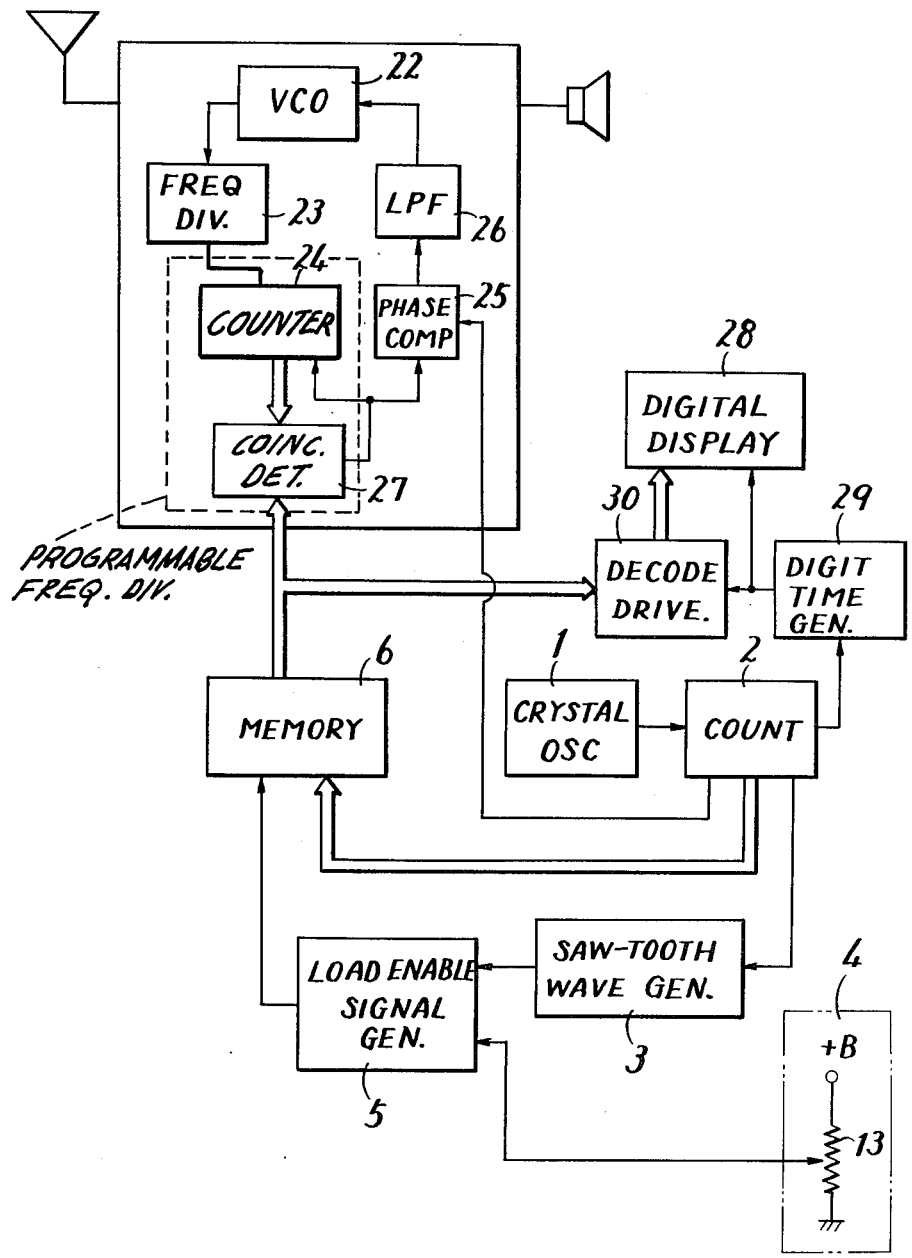
FIG. 5 is a block diagram of a frequency synthesizer radio receiver employing the present invention.

FIG. 5 is a block diagram of a frequency synthesizer radio receiver employing the inventive entry apparatus of a digital value in a memory. As well known, a radio receiver of a digital frequency synthesizer is structured to obtain a local oscillation output from a phase locked loop. A phase locked loop comprises a circuit configuration wherein the output from a reference oscillator oscillating at the frequency $f_r$ and the output of the frequency $f_o$ from a voltage controlled oscillator as frequency divided by a frequency divider at a frequency division rate 1/N are compared by a phase comparator. A voltage signal proportional to the phase difference is withdrawn by a low pass filter in the form of a direct current output and the direct current output is fed back to the voltage controlled oscillator. In this manner in a steady state, i.e. a locked state, of the feedback loop a relation of the oscillation frequency of the voltage controlled oscillator and the oscillation frequency of the reference oscillator achieves the relation $f_o = N \cdot f_r$. Thus, it will be appreciated that a change of the local oscillation frequency in a frequency synthesizer receiver can be achieved by varying the frequency division rate of a frequency divider.

Now an embodiment will be described in more detail by taking an example of FM reception. Referring to FIG. 5, the receiver is shown comprising a voltage controlled type local oscillator 22 utilizing a variable capacitance diode. Assuming that the frequency range of the FM broadcasting is from 76.0 MHz through 90.0 MHz and the intermediate frequency is 10.7 MHz, then it follows that the frequency range of the local oscillation is from 65.3 MHz though 79.3 MHz. The output from the voltage controlled oscillator 22 is applied to a frequency divider 23, called a prescaler, which frequency divides the local oscillation frequency to 1/100. The output from the prescaler 23 is applied to a programmable frequency divider 24 which comprises a counter, the count up value of which is controllable such that a frequency division rate associated with a receiving frequency can be set. The count output in the counter 24 is applied to a coincidence, or comparator, circuit 27 which is also connected to receive a stored digital value from a memory 6. The coincidence circuit is structured to compare the count output from the counter 24 with the stored digital value from the memory 6 to provide a pulse to a phase comparator 25 whenever coincidence of the count output from the counter 24 and the stored digital value from the memory 6 is achieved and to simultaneously provide a reset pulse to the counter 24 to reset the same. The output from the coincidence circuit 27 is applied to one input of a phase comparator 25, the other input of which is connected to receive the reference frequency signal to be described subsequently. Thus, the frequency of the output from the coincidence circuit 27 and the reference frequency of the reference frequency signal are compared by the phase comparator 25 to provide an output signal proportional to the difference of these two frequencies. In the embodiment shown, the reference frequency signal is obtained by frequency dividing by 1/1000, by the use of a counter 2, the oscillation output from a reference oscillator 1 adapted to oscillate at the frequency of 1 MHz. Thus, in the embodiment shown, the frequency of the reference frequency signal is 1 KHz. The output from the phase comparator 25 is smoothed by a low pass filter 26 and is then applied to the voltage controlled local oscillator 22 as a control voltage. In order to display the digital value stored in the memory 6, a digital display 28 is provided which may comprise light emitting diodes, as well known to those skilled in the art. For the purpose of displaying the value in the display 28 in a dynamic manner or on a time sharing basis, as well known, a digit timing pulse generator 29 and a decode/drive circuit 30 are also provided. The digit timing pulse generator 29 is adapted to be driven by the output as frequency divided by 1/2000 by the counter 2 of the output of the frequency 1 MHz from the reference oscillator 1. That is, a frequency of 500 Hz is applied to the time generator 29.

Now assuming a case where an FM broadcasting wave of the frequency 76.0 MHz is to be received by the use of the frequency synthesizer receiver shown in FIG. 5, the variable resistor 13 is manually operated such that the digital value "760" associated with the receiving frequency may be loaded in the memory 6, i.e. such that the numeral value "76.0" MHz is displayed by the display 28, thereby to adjust the timing of the load enable signal. The reason for this may be described as follows.

In order to receive the broadcasting frequency 76.0 MHz, the oscillation frequency of the local oscillator 22 must be 65.3 MHz. Assuming that the local oscillation frequency has reached 65.3 MHz, then it follows that the frequency divided output from the frequency divider 23 is 653 KHz. Therefore, if the frequency division rate of the counter 24 is set to be 1/653, then the output from the counter 24 becomes 1 KHz, which comes to coincide with the reference frequency 1 KHz produced by reference oscillator 1 and counter 2. In other words, if the frequency division rate of the counter 24 is set to 1/653 in the above described situation, then the phase locked loop assumes a locked state only if and when the local oscillation frequency of VCO 22 becomes 65.3 MHz.

Now assuming that the counter 24 is used as an up counter such that the count up operation is initiated starting from the initial setting value "107" corresponding to the intermediate frequency 10.7 MHz, then the counter 24 initiates the counting operation starting from the value "107" and reaches the count output "760" when the same counts up by the value "653". Then, the coincidence circuit 27 is enabled to provide a single pulse to the phase comparator 25 and simultaneously reset the counter 24, thereby to return the value to the initial value "107". The above described operation is repeated, while the counter 24 serves as a 1/653 frequency divider.

From the foregoing description, it would be appreciated that according to the frequency synthesizer receiver shown in FIG. 5, mere manual operation of a variable resistor enables reception of a desired broadcasting frequency and the operation required for selection of a broadcasting station is extremely easy inasmuch as the required operation is substantially the same as those required in a conventional receiver employing a variable capacitor for a tuner.

Figure 6:
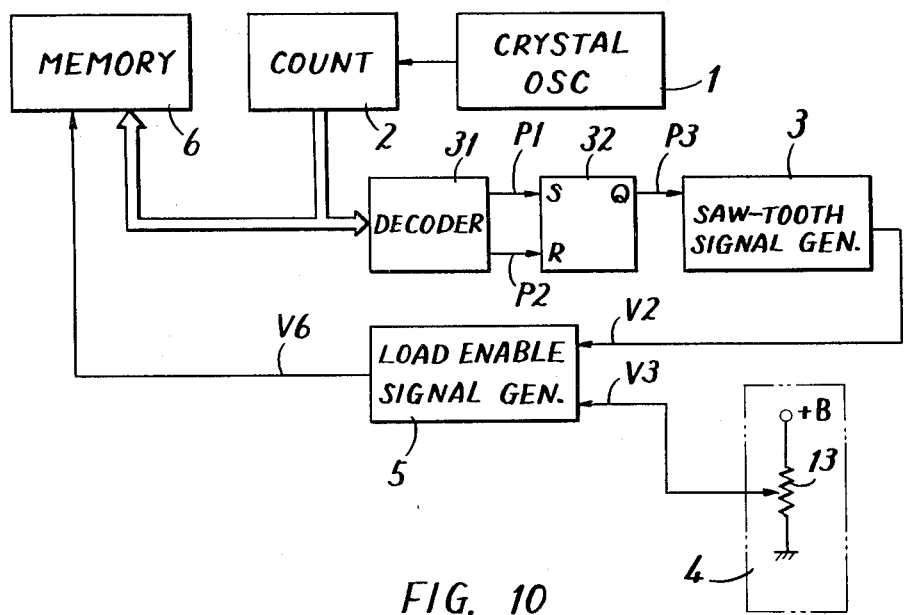
FIG. 6 is a block diagram of a digital value entry apparatus adapted for loading the numerical values of a predetermined range.

Now a case where only a digital value in a predetermined range is loaded in the memory will be described with reference to FIG. 6, which shows a block diagram of an entry apparatus of a digital value adapted for loading only a digital value in a predetermined range. Referring to FIG. 6, the reference oscillator 1, the counter 2, saw-tooth wave generator 3, comparison voltage generator 4, load enable signal generator 5 and the memory 6 are the same as those shown in FIG. 1. In the FIG. 6 embodiment, a specified output from the counter 2 is detected by a decoder 31 and an RS flip-flop 32 is triggered responsive to the detected output from the detector 31, whereby the saw-tooth wave generator 3 is controlled in synchronism with the Q output from the RS flip-flop 32.

Now further description will be made of a case where the oscillation frequency from the reference oscillator 1 is 1 MHz, the counter 2 has been adapted to count for a number "2000", from "0" to "1999", and the decoder 31 is adapted to decode only the values "500" and "1700". If and when the output from the counter 2 counting the output from the reference oscillator 1 reaches the value "1700", the output P1 from the decoder 31 becomes high (see FIG. 7 (c)), and the RS flip-flop 32 is set, whereby the Q output therefrom P3 becomes high (see FIG. 7(c)). The output P3 is applied to the gate electrode of the insulated gate field effect transistor 8, whereby the transistor 8 becomes conductive. As a result, the charge so far stored in the capacitor 9 is instantaneously discharged through the insulated gate field effect transistor 8. Thereafter, if the output of the counter 2 reaches the value "500", the P2 output of the decoder 31 becomes high (see FIG. 7(b)) and the RS flip-flop 32 is reset, whereby the Q output P3 becomes low level (see FIG. 7 (c)). Then the insulated gate field effect transistor 8 turns non-conductive, whereby a current flows through the insulated gate field effect transistor 7 serving as a load resistance. The capacitor 9 is thereby charged with the time constant determined by the resistance of the insulated gate field effect transistor 7 and the capacitance of the capacitor 9.

If and when the output of the counter 2 again reaches the value "1700", the RS flip-flop 32 is again set, whereby the P3 output becomes high. As a result, the insulated gate field effect transistor 8 becomes conductive and the charge stored in the capacitor 9 is instantaneously discharged.

Thus, it will be appreciated that the output V2 from the saw-tooth wave generator 3 rises in synchronism with the specified value output "500" from the counter 2 and falls in synchronism with the specified value output "1700" from the counter 2, as seen in FIG. 7(e). In this embodiment as well, the load enable pulse V6 is obtained when the V2 output exceeds the V3 output, just as in the previous cases.

Since the embodiment shown has been structured such that the saw-tooth wave V2 begins to rise whenever the output from the counter 2 reaches the value "500", it can not happen that a digital value smaller than the value "500" is loaded in the memory. In other words, the lower limit value is set to the value "500". As a matter of practice, for the purpose of providing a slight margin, a value slightly smaller than the required minimum value is selected as a lower limit value. Meanwhile, the output voltage from the saw-tooth wave generator 3 rises not from exactly zero volts but from a voltage slightly higher than zero volts. Therefore, a correction resistor is preferably connected in series between the variable resistor 13 and ground, so that a comparison voltage V3 is obtained when the variable resistor 13 is adjusted to the minimum value may be slightly larger than the value of 0 volts, thereby to set an actually required minimum value.

On the other hand, the upper limit of the numerical value to be loaded is defined by the output waveform V2 from the saw-tooth wave generator 3. More specifically, the upper limit can be defined by selecting the capacitance value of the capacitor 9 and the resistance value of the insulated gate field effect transistor 7 such that the time point when the saw-tooth waveform V2 reaches the peak and the time point when the counter 2 provides a given upper limit value may coincide with each other. As a matter of practice, however, since the end portion of the saw-tooth waveform becomes less linear, a value slightly larger than the actually required maximum value is selected as an upper limit value. The circuit is, therefore, adapted such that the value of the comparison voltage V3 when the variable resistor 13 is adjusted to the maximum value may be a value slightly lower than the maximum value of the saw-tooth wave and the memory 6 is loaded with the actually required maximum value responsive to a load enable signal generated at this point.

Accordingly, in case where the +B voltage source of the saw-tooth wave generator 3 and the +B voltage source of the comparison voltage generator 4 are provided commonly, then it is necessary to connect a correction resistor in series with the variable resistor 13 at the upper end.

Although the decoder 31 is adapted to detect the specified value output "1700" of the counter 2, this is not required to define the upper limit of the value to be loaded in the memory but is required to command the fall of the saw-tooth wave. Accordingly, such specified value output for commanding the fall of the saw-tooth wave may be selected to be any value within the range from the upper limit value to the value "1999" or from "0" to "500". Since the embodiment was structured as described above, only the counter output within a specified range among the possible count output value can be loaded in the memory 6 responsive to the manual operation of the variable resistor 13. If and when a correction resistor is connected to the variable resistor 13, then the manually operable range of the variable resistor and the range of the digital value to be loaded come to coincide with each other. As a result, the disadvantage can be avoided that the digital value to be loaded becomes the upper limit or the lower limit in the course of manual operation of the variable resistor and the value to be loaded cannot be changed any more even if the variable resistor is further adjusted.

In the foregoing, description was made of a case where the timing of the load enable signal is changed by adjusting a comparison voltage. However, even in case where the apparatus is structured to change the timing of the load enable signal by changing the waveform of the saw-tooth wave generator 3, limitation of the range of the numerical value to be loaded can be done, as in case of changing the comparison voltage value as described above, by the use of the decoder for the lower limit value and by the output waveform of the saw-tooth generator for the upper limit value.

In the foregoing description, the counter 2 was described as an up counter. Alternatively, however, the counter 2 may be a down counter. In case where a down counter is used as the counter 2, then the upper limit value is defined by the decoder while the lower limit value is defined by the output waveform of the saw-tooth wave. In the embodiment shown and described, the saw-tooth wave was described as a waveform having a slow rise and an abrupt fall, the slow rise being adapted to correspond to a ramp variation period of the count output. Conversely, a saw-tooth wave of a waveform having a slow fall and an abrupt rise may be employed such that the slow fall of the saw-tooth wave may correspond to a ramp variation period of the count output.

In order to restrict the range of the numerical value to be loaded, the counter 2 per se can be structured to provide only a numerical value within a specified range. However, in case where two or more restriction ranges are required, a corresponding number of counters must be provided, resulting in complexity and increased cost of the apparatus. According to the above described embodiment, however, only a provision of the respective decoders and saw-tooth wave generators is required to the respective restricted ranges, which is much simpler and less expensive as compared with a case where two or more counters are provided.

Assuming a case where the inventive entry apparatus of a digital value is employed in a frequency synthesizer radio receiver which is structured to receive at least two broadcasting bands, such as FM and AM broadcasting bands, the broadcasting frequency ranges of these broadcasting bands are different but a provision of a decoder and a saw-tooth wave generator corresponding to each broadcasting band enables loading of a numerical value within, for example, the range 760 through 900 corresponding to the broadcasting frequencies 76.0 MHz through 90.0 MHz for FM broadcasting and a numerical value within, for example, the range 535 through 1605 corresponding to the broadcasting frequencies 535 KHz through 1605 KHz for AM broadcasting, respectively.

As an alternative scheme for restricting the range of a numerical value to be loaded, the apparatus can be structured such that a decoder is dispensed with and the saw-tooth wave is varied from say 0 V through 10 V so as to correspond to the output "0" through "1999" of the counter, the variation range of the comparison voltage value generated by the variable resistor being restricted to a narrower variation range than the range of 0 V through 10 V, whereby a numerical value within a variation range of the counter output corresponding to the said narrower comparison voltage variation range is adapted to be loaded in the memory. In such a case, however, it follows that the above described very narrow variation range of the comparison voltage comes to correspond to the variation range of a required digital value, with the result that a slight change of the comparison voltage brings about a relatively large change of a digital value to be loaded and it becomes very difficult to load correctly a desired digital value through manual operation of the variable resistor.

According to the above described embodiment, however, the apparatus is structured such that the saw-tooth wave is made to rise in synchronism with the prescribed output for a lower limit value detected by a decoder and the saw-tooth wave is further defined such that the counter output may reach a prescribed upper limit value when the saw-tooth wave reaches a peak voltage. Therefore, a variation range of the digital value corresponds to a full range of a voltage variation of the saw-tooth wave, with the result that correct entry of a desired digital value can be effected with ease.

As a matter of practice, a variation range of a desired digital value cannot be made to correspond to a full voltage variation range of the saw-tooth wave because the saw-tooth wave is less linear at the end portion and therefore the variation range of a desired digital value is accordingly made to correspond to a narrower voltage variation range. Even in such a case, the operation of the loading is easy as compared with a case where a variation range of a comparison voltage value is restricted.

Figure 8:
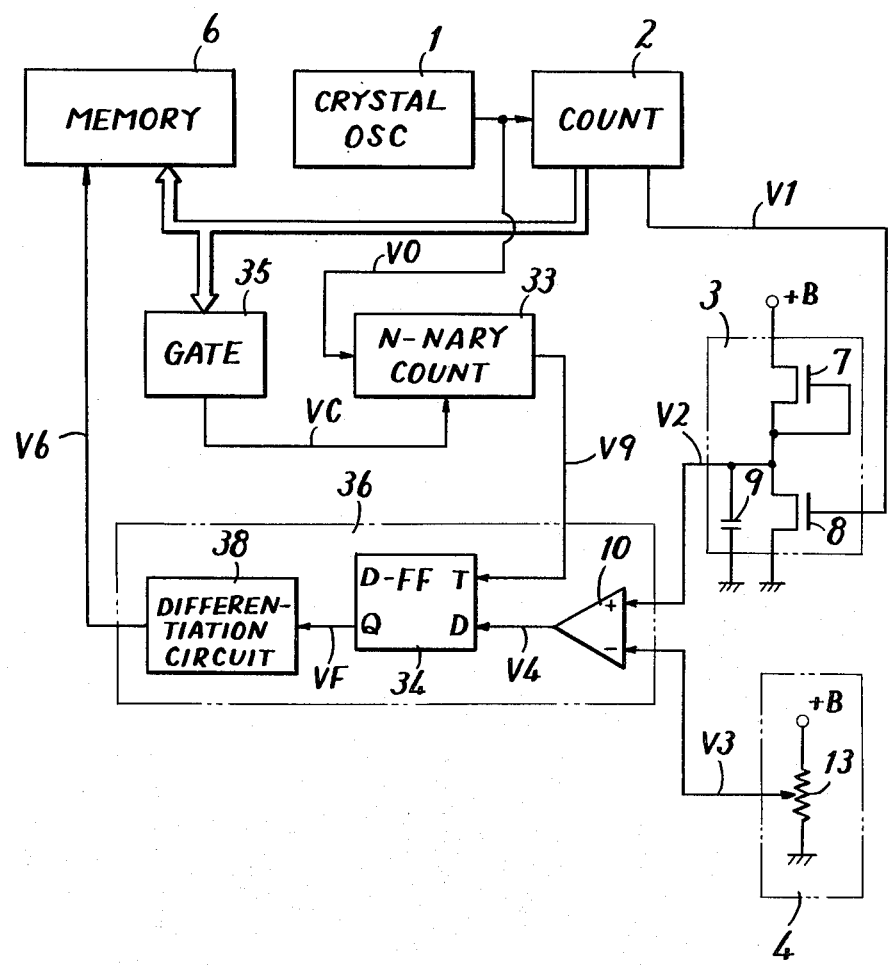
FIG. 8 is a block diagram of a digital value entry apparatus adapted for loading a multiple of a predetermined value.

Now description will be made of a case where a numerical value is loaded in a memory at a predetermined numerical value interval. As described previously, the inventive entry apparatus of a digital value can be employed in a frequency synthesizer radio receiver. According to the current Japanese standard system for AM broadcasting, the broadcasting frequencies are to be allotted to the respective AM broadcasting stations at an interval of 10 KHz throughout the AM frequency band of 535 KHz through 1605 KHz. However, it has been determined that in the future the frequency allottment is to be changed from a 10 KHz interval to a 9 KHz interval. Even in such a situation, the present invention can be advantageously employed such that only the value corresponding to the station interval frequency "9" may be loaded in the memory, while any other numerical values need not be loaded. FIG. 8 shows a block diagram of another embodiment of the inventive entry apparatus of a digital value adapted for loading only for a multiple of a predetermined numerical value such as "9" as in the above described case.

Figure 9:
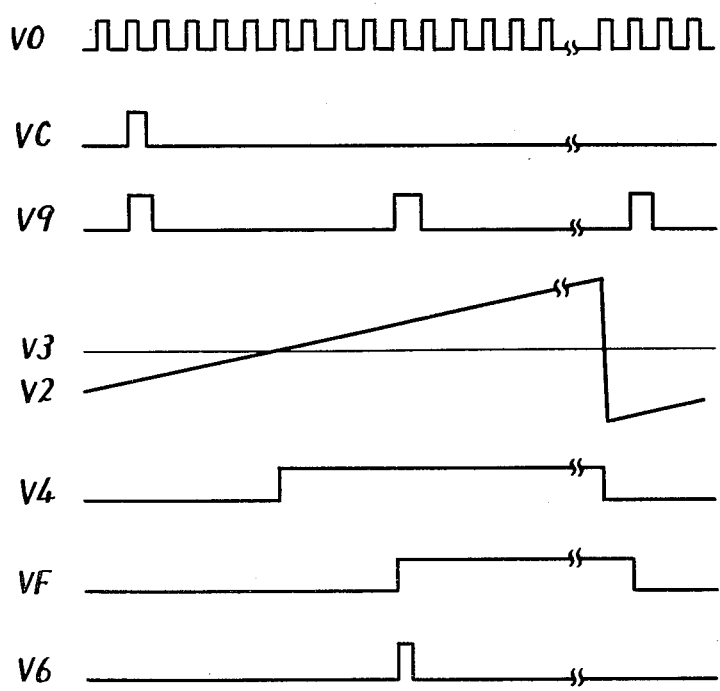
FIG. 9 shows waveforms of the signals at various portions of the FIG. 8 embodiment.

According to the embodiment shown, an N-nary counter 33 making a counting operation, where N is the number "9", responsive to the output V0 from the reference oscillator 1 is provided and the 9 count output signal V9 from the N-nary counter 33 is applied to the T terminal of a D flip-flop 34. The embodiment has been adapted such that if and when the contents in the counter 2 are zero a clear signal Vc obtained through a gate 35 is applied to the N-nary counter 33 to reset the same. Therefore, each time nine input pulses V0 are applied to the N-nary counter 33, a pulse signal V9 is received by the T terminal of the D type flip-flop 34. Therefore, the D type flip-flop 34 causes the output signal V4 from the voltage comparator 10 to be synchronised with the N-nary output signal V9, as shown in FIG. 9, whereby a signal VF is obtained from the flip-flop 34 and a load enable signal V6 for enabling the memory is obtained from a differentiation circuit 38. It would be appreciated that the time point when the load enable signal V6 is obtained coincides with a time point where the output of the counter 2 is a multiple of the number "9".

Thus, manual operation of the variable resistor 13 to increase or decrease the output voltage V3 enables a numerical value to be loaded at the interval of the value "9" corresponding to the frequency difference 9 KHz.

Figure 10:
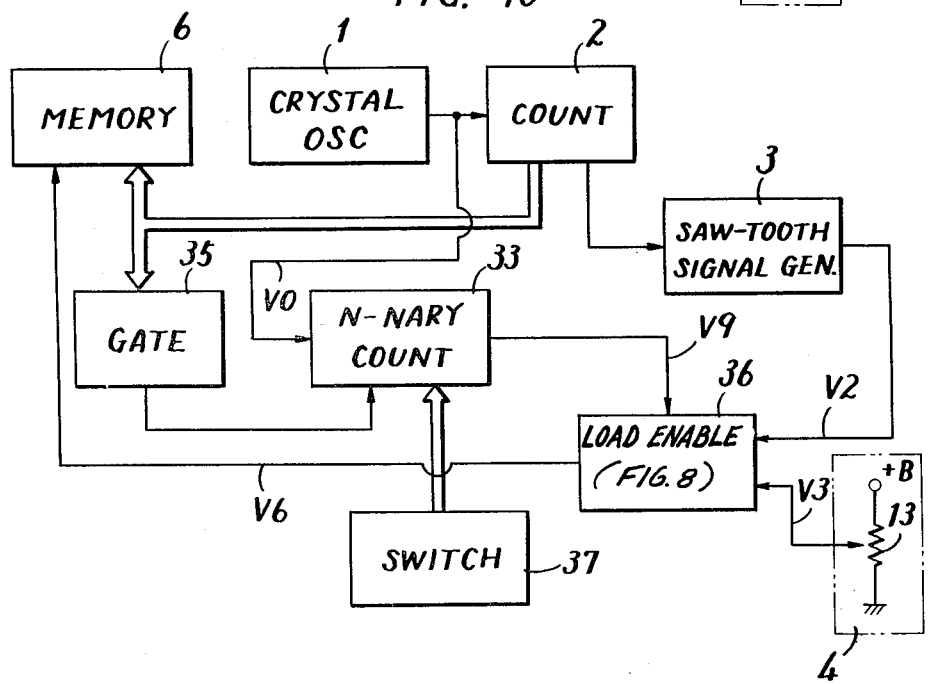
FIG. 10 is a block diagram of a digital value entry apparatus adapted for loading the numerical value at a predetermined cycle.

In the foregoing, description was made of a case where the broadcasting frequency is a multiple of the difference frequency 9 KHz. Now further description will be made of a case where the station interval frequency is 9 KHz and the broadcasting frequency is not a multiple of the difference frequency 9 KHz, with the reference to FIG. 10, which shows a block diagram of another embodiment of the inventive entry apparatus of a digital value adapted for loading a numerical value at a predetermined value interval. Referring to FIG. 10, an N-nary counter 33 is provided with a switch 37 and a load enable signal obtained from a gate circuit 35 when the output of the counter 2 becomes "0" is applied to the N-nary counter 33, when a given value out of the numerals 0 through 8 selected by the switch 37 is set to the N-nary counter 33 by way of an initial value. Accordingly, if and when the numeral 1 is set as an initial value, then a multiple of the numeral "9" minus the numeral "1" is loaded in the memory 6 and, if and when the numeral 2 is set as an initial value, then a multiple of the numeral "9" minus the numeral "2" is loaded in the memory 6. However, a read only memory or the like may be utilized in place of the switch 37.

The embodiments of FIGS. 8 and 10 can be used to receive signals in the AM band. More specifically, there is shown an entry apparatus of digital value utilized in an AM band synthesizer radio receiver. As explained previously, the frequency division ratio of the programmable frequency divider (counter 24 and coincidence circuit 27 of FIG. 5) is controlled as a function of the digital value set in the memory 6, whereby a desired AM broadcasting signal can be received as is the same as in the case of the FM broadcasting reception, described in conjunction with FIG. 5.

Referring to FIG. 8, the oscillation frequency of the oscillator 1 is selected to the 1 MHz and the counting range by the counter 2 is selected to be 0 to 1999. The frequency range of the AM broadcasting in Japan, for example, ranges from 535 kHz to 1605 kHz and the numerical value 535 to 1605 corresponding thereto can be written in the memory 6. In the case where the entry apparatus of a digital value shown in FIGS. 8 and 10 is employed in a synthesizer type radio receiver having a phase locked loop (FIG. 5) and the reference frequency signal being supplied to the phase comparator 25 (which is obtained from the counter 2 in the case of the FIG. 5 embodiment) is selected to be 1 kHz, a change of the frequency division ratio by the programmable frequency divider on a one-by-one basis causes a change of the oscillation frequency by the voltage controlled oscillator 22 (the local oscillation frequency) on a 1 kHZ-by-1 kHz basis. However, since the interstation frequency of the AM broadcasting is 9 kHz, it is not necessary to change the local oscillation frequency on a 1 kHz-by-1 kHz basis. Therefore, the embodiments shown in FIGS. 8 and 10 have been structured such that the digital value being set in the memory 6 is selected to be that corresponding to nine intervals, the frequency division ratio of the programmable frequency divider is changed on "9" by "9" basis, whereby the local oscillation frequency may be changed on a 9 kHz-by-9 kHz basis.

There is now described an example where the AM broadcasting is received based on the FIG. 5 program. In the case of FM broadcasting, the lower superheterodyne system is employed and the numerical value "107" corresponding to the intermediate frequency was preset in the programmable frequency divider. However, in the case of AM broadcasting, since the upper superheterodyne system is employed, the numberical value "455" corresponding to the intermediate frequency (455 kHz) cannot be preset in the programmable frequency divider. Therefore, a complement of "455" is preset. More specifically, assuming that the counting number range of the counter 24 of the programmable frequency divider is "0 to 3999", the numerical value "3545" is preset. Now assuming that a signal at the broadcasting frequency 535 kHz is to be received, for example, it is necessary that the oscillation frequency of the voltage controlled oscillator 22 be 990 kHz (535+455). Accordingly, it is necessary that the frequency division ratio of the programmable frequency divider be selected to be 990. Therefore, the numerical value "3545" is preset in the programmable frequency divider and the numerical value "535" corresponding to the broadcasting frequency is set in the memory 6.

The apparatus is structured such that when the counter 24 of the programmable frequency divider starts up-counting from the numerical value "3545" and the count value changes through "0" to reach the numerical value "535" (i.e. zero means that the set value in the memory 6 has been reached), the counter 24 of the programmable frequency divider is cleared, whereupon again the numerical value "3545" is preset and one pulse is supplied to the phase comparator 25. By this arrangement the programmable frequency divider functions as a frequency divider having a frequency division ratio of "990". Accordingly, the local oscillation frequency of the voltage controlled oscillator 22 becomes 990 kHz and the numerical value "535" set in the memory 6 can be utilized as a broadcasting frequency indicating signal.

Although the present invention has been described and illustrated in detail, it is to be clearly understood that the same is by way of illustration and example only and is not to be taken by way of limitation, the spirit and scope of this invention being limited only by the terms of the appended claims.

What is claimed is:

1. Digital value entry apparatus for a radio receiver comprising
   tuner means including phase lock loop circuit means having oscillating means and control means including a programmable divider means for controlling the frequency of said oscillating means for selecting a first signal within a given frequency band,
   means including means for generating clock pulses and means for counting said clock pulses for generating a repetitively changeable digital value as a function of time over a predetermined range of values corresponding to at least a portion of said frequency band including the frequency of said first signal,
   memory means coupled to said changeable digital value generating means and responsive to a load enable signal for loading in said memory means a digital value which corresponds to said first signal, the output of said memory means being coupled to said programmable divider means to establish its division ratio and thereby control the frequency of said oscillating means,
   means operatively coupled to said changeable digital value generating means for providing to said memory means a load enable signal in synchronism with and at a predetermined phase time of the repetitive change of said changeable digital value corresponding to said first signal,
   an N-nary counter responsive to said clock pulses for repetitively counting a number N of said clock pulses and producing an output representative of said count,
   means responsive to the output of said N-nary counter and coupled to said load enable signal providing means for controlling generation of said load enable signal in synchronism with the output from said N-nary counter, whereby the digital value is loaded to said memory means at an interval of the pulse count number N, and
   means operatively coupled to said load enable signal providing means for adjusting the phase time of said load enable signal, whereby a digital value obtainable from said changeable digital value generating means at the phase time, as adjusted by said adjusting means, is loaded in said memory means responsive to the load enable signal.

2. An entry apparatus of a digital value in accordance with claim 1, which further comprises means operatively coupled to said N-nary counter for setting an initial count value in said N-nary counter.

3. An entry apparatus as in claim 1 further comprising means for limiting the range of digital values applied to said memory means from said predetermined range of digital values to correspond to the entire said given frequency band.

4. An entry apparatus of a digital value in accordance with claim 1, wherein the output frequency of said local oscillator means is divided by said programmable divider means of said phase lock loop circuit control means which further comprises comparing means for producing a control signal to control the frequency of said local oscillator means, said counting means of said changeable digital value generating means further providing a reference frequency signal which is applied to said comparing means, said comparing means reponsive to the output from said programmable divider means and said reference frequency signal obtained from said counting means for detecting the frequency difference between the frequency of the output from said programmable divider means and the frequency of said reference frequency signal for providing a control signal to said oscillating means.

5. An entry apparatus as in claim 1 wherein said load enable signal providing means comprises
   means responsive to said changeable digital value generating means for generating a ramp signal in synchronism with the repetitive change of said digital value, said ramp signal having a waveform changeable as a function of time in synchronism with the repetitive change of said changeable digital value,
   means for generating a reference signal having a reference potential to be compared with said ramp signal, and
   means operatively coupled to said ramp signal generating means for comparing said ramp signal and said reference signal for providing a load enable signal whenever both coincide with each other.

* * * * *